United States Patent
Chappaz et al.

(10) Patent No.: US 9,152,231 B2
(45) Date of Patent: Oct. 6, 2015

(54) METHOD OF CONTROLLING A HANDHELD OBJECT USING HAPTIC FEEDBACK

(75) Inventors: Cedrick Chappaz, Pontcharra (FR); Yves Gilot, Saint Egreve (FR); Olivier Girard, Saint Egreve (FR)

(73) Assignees: STMicroelectronics SA, Montrouge (FR); STMicroelectronics (Grenoble 2) SAS, Grenoble (FR)

(*) Notice: Subject to any disclaimer, the term of this patent is extended or adjusted under 35 U.S.C. 154(b) by 733 days.

(21) Appl. No.: 13/490,119

(22) Filed: Jun. 6, 2012

(65) Prior Publication Data

US 2012/0313766 A1 Dec. 13, 2012

(30) Foreign Application Priority Data

Jun. 7, 2011 (FR) .................................. 11 54942

(51) Int. Cl.
| | | |
|---|---|---|
| *H04B 3/36* | (2006.01) | |
| *G06F 3/01* | (2006.01) | |
| *H01L 41/04* | (2006.01) | |
| *H01L 41/09* | (2006.01) | |

(Continued)

(52) U.S. Cl.
CPC .............. *G06F 3/016* (2013.01); *H01L 41/042* (2013.01); *H01L 41/0986* (2013.01); *H01L 41/318* (2013.01); *H01L 41/332* (2013.01); *Y10T 29/49117* (2015.01); *Y10T 29/49155* (2015.01); *Y10T 29/49156* (2015.01); *Y10T 29/49165* (2015.01)

(58) Field of Classification Search
CPC ... G06F 3/016; H01L 41/042; H01L 41/0986; H01L 41/318; H01L 41/332; H01L 41/09

USPC .................................. 340/407.1; 29/847, 829
See application file for complete search history.

(56) References Cited

U.S. PATENT DOCUMENTS

| 6,816,049 B2 | 11/2004 | Watanabe et al. |
| 6,937,124 B1 | 8/2005 | Nakamura et al. |

(Continued)

FOREIGN PATENT DOCUMENTS

| EP | 1-544-720 A1 | 6/2005 |
| EP | 1-956-466 A1 | 8/2008 |

(Continued)

OTHER PUBLICATIONS

Dana et al., "Thin film piezoelectric vibrator panel," *IBM Technical Disclosure Bulletin* 34(3):132-134, Aug. 1991, International Business Machines Corp., Armonk, NY, XP000210473.

(Continued)

*Primary Examiner* — Eric M Blount
(74) *Attorney, Agent, or Firm* — Seed IP Law Group PLLC

(57) ABSTRACT

The disclosure relates to a method for controlling an object configured to be handheld and including vibratory actuators. The method including mechanically coupling a first group of at least one vibratory actuator to a first part of the object, mechanically coupling a second group of at least one vibratory actuator to a second part of the object, the first and the second parts being configured to be able to vibrate independently of each other, and to come into contact with different areas of the hand of the user holding the object, and transmitting to each group of actuators, an electrical signal having a frequency adapted to the resonance frequency of the part to which it is mechanically coupled.

19 Claims, 5 Drawing Sheets

(51) Int. Cl.
*H01L 41/318* (2013.01)
*H01L 41/332* (2013.01)

(56) References Cited

U.S. PATENT DOCUMENTS

| | | | |
|---|---|---|---|
| 7,292,227 B2 * | 11/2007 | Fukumoto et al. | 345/173 |
| 7,605,523 B2 * | 10/2009 | Katsuki et al. | 310/363 |
| 7,663,604 B2 | 2/2010 | Maruyama et al. | |
| 8,156,809 B2 | 4/2012 | Tierling et al. | |
| 8,179,022 B2 | 5/2012 | Murata | |
| 8,306,500 B2 * | 11/2012 | Tho et al. | 455/347 |
| 8,416,027 B2 | 4/2013 | Takizawa | |
| 8,547,333 B2 * | 10/2013 | Pasquero et al. | 345/161 |
| 8,593,409 B1 * | 11/2013 | Heubel et al. | 345/173 |
| 8,760,413 B2 * | 6/2014 | Peterson et al. | 345/173 |
| 2002/0149561 A1 | 10/2002 | Fukumoto et al. | |
| 2003/0067449 A1 | 4/2003 | Yoshikawa et al. | |
| 2006/0097996 A1 | 5/2006 | Tabata | |
| 2006/0132000 A1 | 6/2006 | Katsuki et al. | |
| 2006/0181522 A1 | 8/2006 | Nishimura et al. | |
| 2007/0080951 A1 | 4/2007 | Maruyama et al. | |
| 2007/0236450 A1 * | 10/2007 | Colgate et al. | 345/156 |
| 2008/0122315 A1 | 5/2008 | Maruyama et al. | |
| 2009/0115005 A1 | 5/2009 | Watanabe | |
| 2010/0102671 A1 | 4/2010 | Murata | |
| 2010/0321330 A1 | 12/2010 | Lim et al. | |
| 2011/0115340 A1 | 5/2011 | Lee | |
| 2011/0134082 A1 | 6/2011 | Mitsuhashi et al. | |
| 2011/0227657 A1 | 9/2011 | Nishizawa et al. | |
| 2012/0068835 A1 * | 3/2012 | Li | 340/407.2 |
| 2012/0086651 A1 | 4/2012 | Kwon et al. | |
| 2012/0126941 A1 | 5/2012 | Coggill | |
| 2012/0139851 A1 | 6/2012 | Kim et al. | |
| 2012/0162143 A1 | 6/2012 | Kai et al. | |
| 2012/0256848 A1 * | 10/2012 | Madabusi Srinivasan | 345/173 |
| 2012/0313766 A1 | 12/2012 | Chappaz et al. | |
| 2012/0313874 A1 | 12/2012 | Chappaz et al. | |
| 2013/0271412 A1 * | 10/2013 | Adachi et al. | 345/173 |
| 2014/0333564 A1 * | 11/2014 | Hong et al. | 345/173 |

FOREIGN PATENT DOCUMENTS

| | | |
|---|---|---|
| EP | 2-202-619 A1 | 6/2010 |
| WO | 2010/054014 A1 | 5/2010 |

OTHER PUBLICATIONS

Sergeant et al., "Geometric optimization of an ultrasonic tactile plate," *Sensors and Actuators A 161*:91-100, 2010.

* cited by examiner

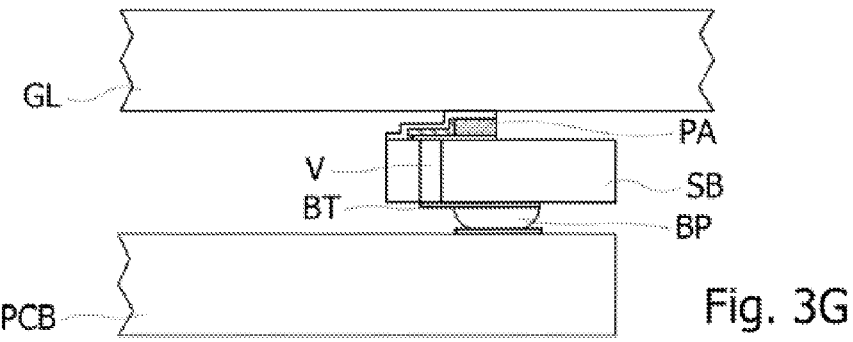
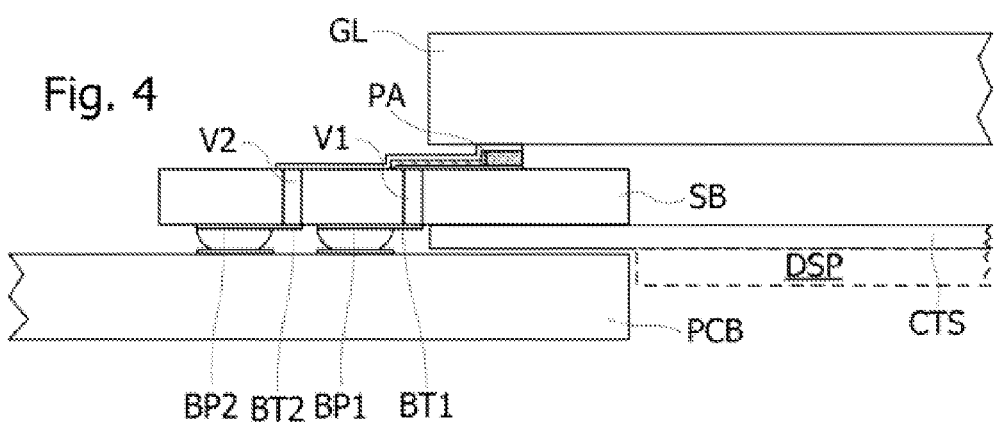
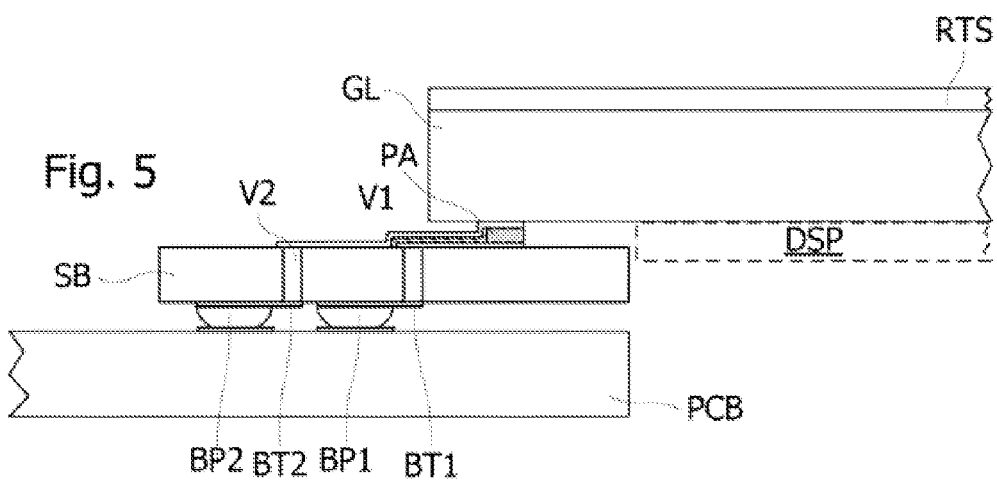

METHOD OF CONTROLLING A HANDHELD OBJECT USING HAPTIC FEEDBACK

BACKGROUND

1. Technical Field

The present disclosure relates to a control interface using haptic feedback, i.e., comprising one or more vibratory actuators able to transmit a vibration to the user. The present disclosure relates to any type of object comprising a control interface provided to be handheld.

2. Description of the Related Art

There are touch panels using haptic feedback comprising one or more vibratory actuators which are excited by an electrical signal, for example when the terminal detects the input of a command by the user using the touch panel. A vibration may thus be transmitted to the user to indicate for example that his/her command has been acknowledged.

The vibratory actuators used in touch panels using haptic feedback are discrete components of piezoelectric, electromagnetic or electrostatic type, which are mechanically coupled, directly or indirectly, to a plate forming the touch panel, where the user puts the finger or a stylus. The result is that some dimensions may be an issue in a small object such as a mobile phone, in particular when the touch panel is associated with a display. Indeed, the vibratory elements cannot be arranged in front of the display and there is often little room left around the display in the mobile terminal. The result is also that the manufacturing and integration costs are therefore not negligible. It is however desirable to integrate vibratory actuators into various objects comprising a part provided to be handheld.

In addition, the high tactile sensitivity of the fingers of the hand may be used to transmit to the user more complex information than the simple acknowledgement of a command.

It may therefore be desirable to provide a small vibratory actuator, which may easily be integrated into an object such as a device handle or an object provided to be handheld such as a mobile phone. It may also be desirable to provide a device which is able to generate various vibrations susceptible of being distinguished to transmit to a user various pieces of information in an intelligible way.

BRIEF SUMMARY

Embodiments relate to a method for manufacturing an object configured to be handheld, the method comprising: forming vibratory actuators, mechanically coupling a first group of at least one vibratory actuator to a first part of the object, mechanically coupling a second group of at least one vibratory actuator to a second part of the object, the first and the second parts being susceptible of vibrating independently of each other, and being configured to come into contact with different areas of the hand of the user holding the object, and connecting the first and second groups of actuators to a control unit configured to transmit to each group of actuators, an electrical signal having a frequency adapted to the resonance frequency of the part to which it is mechanically coupled.

According to an embodiment, forming the vibratory actuators comprises forming on a wafer at least one multilayer structure, each multilayer structure comprising an element susceptible of vibrating when it is subjected to an electrical signal, and electrodes for transmitting an electrical signal to the vibratory element.

According to an embodiment, forming the vibratory actuators comprises forming a via going through the wafer to electrically link at least one of the electrodes of each vibratory element to a rear face of the wafer, each vibratory element being formed on a front face of the wafer, opposite to the rear face.

According to an embodiment, each vibratory actuator is formed by depositing onto the wafer and etching a layer of a piezoelectric material such as PZT, the wafer being in a semi-conductor or electrically insulating material.

According to an embodiment, one of the two parts of the object is a touch panel plate or touch panel display screen, the method comprising mechanically coupling several vibratory elements to the plate.

Embodiments also relate to a method for controlling an object configured to be handheld and comprising vibratory actuators, the method comprising: mechanically coupling a first group of at least one vibratory actuator to a first part of the object, mechanically coupling a second group of at least one vibratory actuator to a second part of the object, the first and second parts being configured to be able to vibrate independently of each other, and to come into contact with different areas of the hand of the user holding the object, and transmitting to each group of actuators, an electrical signal having a frequency adapted to the resonance frequency of the part to which it is mechanically coupled.

According to an embodiment, the method comprises modulating the electrical signals transmitted to the first and second groups of actuators, by different modulation signals and having a modulation factor which may reach 100%.

According to an embodiment, the method comprises providing a detection signal indicating the presence or not of the user's hand on or near the object, and transmitting to the actuators electrical signals only when the detection signal indicates the presence of the user's hand.

According to an embodiment, the method comprises selecting signals to transmit to the actuators as a function of detected events or state information of the object.

Embodiments also relate to an object comprising vibratory actuators, obtained by the manufacturing method as previously disclosed, the object being configured to be handheld, a first group of at least one vibratory actuator mechanically coupled to a first part of the object, a second group of at least one vibratory actuator mechanically coupled to a second part of the object, the first and second parts being configured to be able to vibrate independently of each other, and to come into contact with different areas of the hand of the user holding the object, and a control unit configured to transmit to each group of actuators, an electrical signal having a frequency adapted to the resonance frequency of the part to which it is mechanically coupled.

According to an embodiment, the control unit is configured to modulate the electrical signals transmitted to the first and second groups of actuators, by different modulation signals and having a modulation factor which may reach 100%.

According to an embodiment, the object comprises a presence detector for detecting the user's hand, the control unit being configured to transmit to the vibratory actuators electrical signals only when the detector detects the presence of the user's hand.

According to an embodiment, the control unit is configured to transmit to the vibratory actuators electrical signals selected as a function of detected events or state information of the object.

Embodiments also relate to a terminal complying with the object as previously disclosed, the terminal comprising a touch panel of capacitive or resistive type, a plate on which a user may put the finger to excite the touch panel, one of the vibratory actuators being mechanically coupled to the plate.

According to an embodiment, the terminal comprises a display screen associated with the touch panel, the plate being transparent and arranged on the display screen.

BRIEF DESCRIPTION OF THE SEVERAL VIEWS OF THE DRAWINGS

Embodiments will be described hereinafter, in relation with, but not limited to the appended figures wherein:

FIGS. 3A to 3G are section views of a substrate, at different manufacturing steps of a vibratory actuator, according to one embodiment;

FIG. 4 shows in cross-section an example of integration of the vibratory actuator on a touch panel of capacitive type;

FIG. 5 shows in cross-section an example of integration of the vibratory actuator on a touch panel of resistive type;

DETAILED DESCRIPTION

Figure 1:
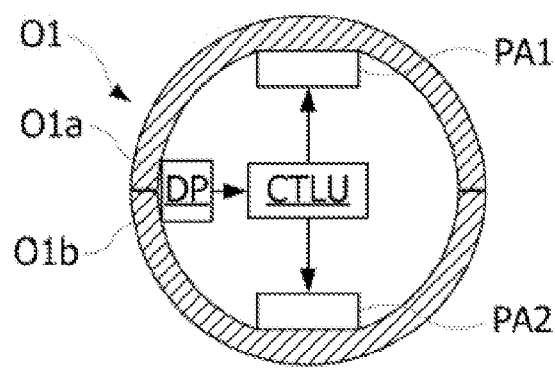
FIGS. 1 and 2 schematically show in cross-section objects provided with vibratory actuators, according to embodiments.

FIG. 1 shows an object O1 comprising a housing or a part of housing in the shape of a handle with a circular or substantially circular right section. The object O1 may thus be a handle of household appliance (a kettle, vacuum, hair dryer, shaver, etc.), a wheel of a vehicle or a game console, a broomstick, a control handle of a game console, a computer mouse, etc.

According to one embodiment, vibratory actuators PA1, PA2 are arranged in the object O1 and mechanically coupled to two parts O1a, O1b of the housing of the object O1, which are susceptible of vibrating independently of each other. The two parts O1a, O1b may be configured so that when a user holds the object O1, one of the two parts O1a, O1b is in contact with a part of the hand holding the object like the thumb, and the other of the two parts is in contact with another part of the hand comprising for example one or more of the others fingers of the hand holding the object.

Figure 2:
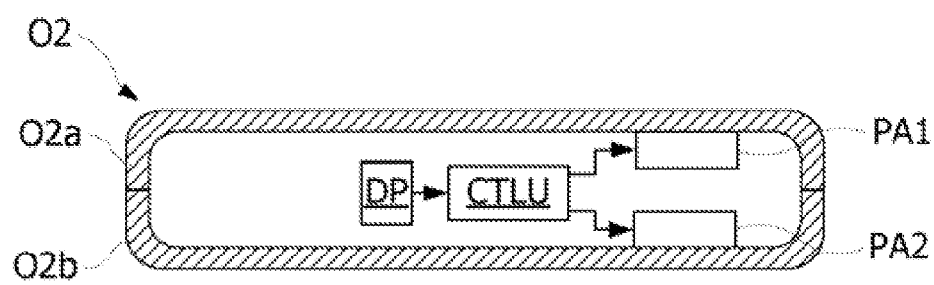

FIG. 2 shows an object O2 comprising a housing having a substantially rectangular right section, provided to be handheld. The object O2 may for example be a mobile phone, a personal digital assistant (PDA), a global positioning system (GPS), a reader of multimedia files, a control interface of computer, etc.

According to one embodiment, vibratory actuators PA1, PA2 are installed in the object O2 and mechanically coupled to two parts O2a, O2b of the housing of the object O2, which are susceptible of vibrating independently of each other. The two parts O2a, O2b may be configured so that when a user holds the object O2, one of the two parts O2a, O2b is in contact with a part of the hand holding the object like the thumb, and the other of the two parts is in contact with another part of the hand holding the object comprising for example one or more of the other fingers of the hand holding the object. It is to be noted that one of the parts O2a, O2b of the housing may comprise a touch panel or a display screen, possibly a touch screen.

Admittedly, it may be provided to make a handheld housing or part of housing, comprising more than two parts susceptible of vibrating independently of one another. In this case, each part may be mechanically coupled to at least one vibratory actuator PA1, PA2.

According to one embodiment, the actuators PA1, PA2 are controlled by a control unit CTLU configured to generate for each actuator PA1, PA2 a different excitation signal adapted to the resonance frequency of the part O1a, O1b, O2a, O2b to which the actuator is coupled. Different texture effects may be produced by applying to each excitation signal different amplitude modulations for example at a modulation factor which may be chosen between 10 and 100%. The modulating signals may be square signals which duty factor and frequency are chosen as a function of the texture effect to be obtained. The frequency of the modulating signals may be chosen between 20 kHz and 100 kHz. The excitation signals may be configured to vibrate each of the actuators during periods of 0.5 to 10 s.

According to the information to transmit to the user, the control unit may select a combination of two modulating signals to be applied to the signals transmitted to the actuators PA1, PA2.

The control unit CTLU may be connected to a presence detector DP or proximity detector of the user's hand to emit the excitation signals of the actuators PA1, PA2 only when the user holds the object O1, O2 or gets his/her hand close to the object. The detector DP may be a capacitive or resistive presence detector like those used in touch panels. In the case of a control element of a game console or a computer, various different signals may be transmitted as vibrations to the user as a function of events occurring in a program executed by the console or computer.

Thanks to the arrangements which have just been described, various applications may be considered. For example, in the case of a kettle, the control unit CTLU may be configured to control the actuators PA1, PA2 to make different parts of the kettle handle vibrate, as a function of the temperature of the water in the kettle and/or the water level. In the case of a vehicle wheel, the control unit CTLU may be configured to control actuators PA1, PA2 arranged in the wheel, so as to transmit different signals to the user, for example when detecting a danger or another fault in the vehicle, according to the danger or fault.

According to one embodiment, the vibratory actuators PA1, PA2 are formed on a wafer by using integrated circuit manufacturing techniques, and in particular techniques of micro photolithography, and micro etching of a substrate. The wafer forming the substrate may be in a semiconductor material, but not necessarily. Thus, the wafer may be in silicon, or any electrically insulating material which complies with integrated circuit manufacturing techniques, and with the temperatures used by the different processes to form a vibratory actuator described below.

Figure 3A:
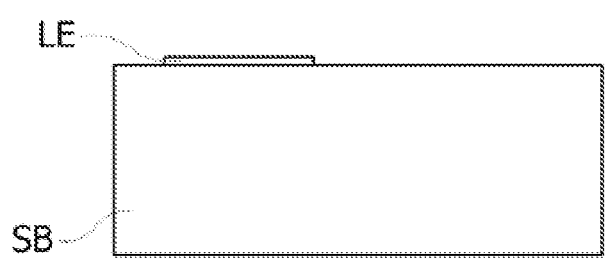

Thus, FIGS. 3A to 3G show in cross-section a wafer SB at different manufacturing steps of one or more vibratory actuators. In FIG. 3A, one or more conductive paths each forming a lower electrode LE of vibratory element and a connection path of the electrode LE, are formed on the wafer SB. Each electrode LE may be made conventionally by depositing a metal layer, for example in gold or titanium by sputtering on the wafer SB. A layer of photoresist is then deposited onto the metal layer, then a mask pattern is transferred to the photosensitive layer, and the exposed parts of the metal layer are removed.

Figure 3B:
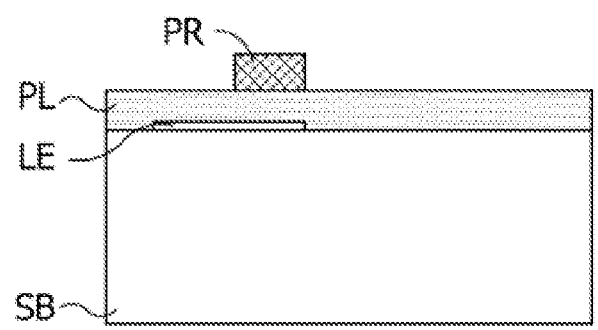
Figure 3C:
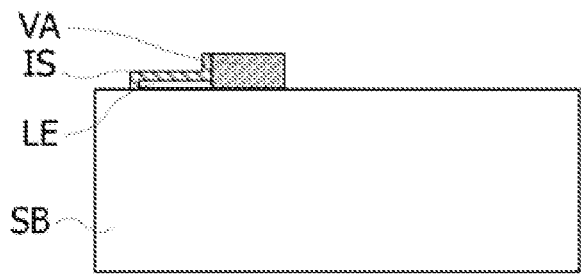

In FIG. 3B, a layer PL in a material susceptible of vibrating under the effect of an electrical signal, for example a piezoelectric material, is deposited onto the wafer SB. The piezoelectric material is for example a piezoelectric material such as a piezoelectric oxide like PZT (Lead Zirconate Titanate—Pb($Zr_xTi_{1-x}$)$O_3$), lead titanate (PbTiO$_3$), or barium titanate (BaTiO$_3$). This material may be deposited onto the wafer SB using a SOL-GEL process by rotating the wafer, and applying to the layer thus deposited annealing progressively reaching 700° C. for PZT. A layer of photoresist PR is then deposited onto the wafer SB, and a mask pattern is transferred to the layer PR. The mask pattern allows parts of the layer PL to be removed. Removing the layer PL is for example performed by Inductively Coupled Plasma ICP. The layer PR is then removed. There is then only a block VA of piezoelectric material left, on each electrode LE (FIG. 3C). The material forming each block VA is able to generate a vibration which is perceptible by a user, when the material is subjected an electric excitation.

In FIG. 3C, an electrically insulating layer IS may be deposited onto some parts of the conductive paths connected to the electrodes LE, and the block VA. The layer IS may be deposited as previously, by depositing onto the wafer SB, an electrically insulating material, then a layer of photoresist, and by transferring to the photosensitive layer a mask pattern. The exposed parts of the insulating layer are then etched, and the photosensitive layer is then removed.

Figure 3D:
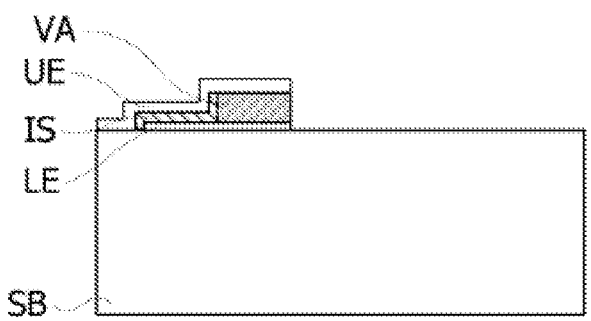

In FIG. 3D, an upper electrode UE of vibratory element and a connection path of the electrode UE are formed on each block VA and on some parts of the insulating layer IS. The electrode UE and the connection path of the electrode UE may be formed as previously, for example by depositing a metal layer by sputtering and etching the metal layer. The metal used to form the electrode UE is for example chromium or nickel. The set consisting of the block VA, the electrodes LE, UE and the insulating layer IS between the connection paths of the electrodes LE, UE forms a vibratory element PA. It is to be noted that forming an insulating layer IS between the conductive connection paths of the two electrodes LE, UE may not be necessary, in particular if the conductive connection paths of the electrodes spread out on the wafer from two different sides of the block VA.

Figure 3E:
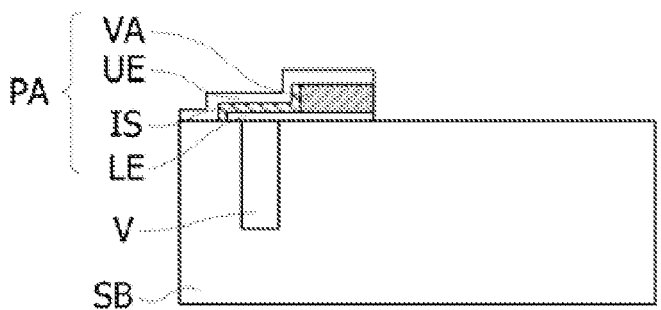
Figure 3F:
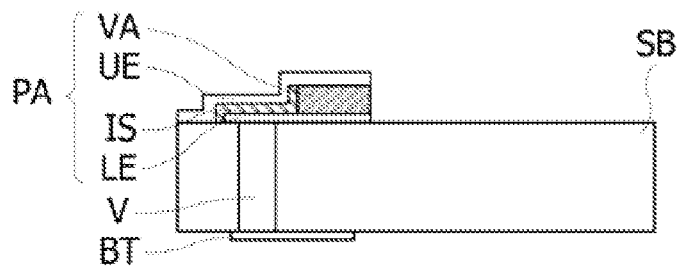

In FIGS. 3E and 3F, vias going through the wafer SB may be formed to electrically link to the rear face of the wafer SB, one and/or the other conductive connection path of the electrodes LE, UE of each vibratory element PA. To that end, a metalized hole V is formed in the wafer SB, in each conductive path to be linked to the rear face of the wafer (FIG. 3E). The wafer SB is then thinned, for example by mechanically grinding its rear face, until the metal deposited into each hole V appears on the rear face (FIG. 3F). Each metalized hole opening onto the rear face of the wafer SB thus forms a through-via V. In FIG. 3F, a routing conductive path BT linked to each through-via V, is formed on the rear face of the wafer SB. The wafer SB is then cut out to obtain vibratory actuators comprising one or more vibratory elements, for example arranged in rows.

In FIG. 3G, the vibratory element PA on the plate SB is mechanically coupled to a plate GL to be vibrated, for example using a layer of glue, and the path BT on the rear face of the plate SB is welded by a connection ball BP on a board PCB, for example a printed circuit board or a substrate BGA.

The actuators obtained by the manufacturing method which has just been described, have small dimensions, which allows them to be easily integrated into handheld objects.

The plate GL may be a part of housing. According to one embodiment, the plate GL is opaque and constitutes the upper surface of a touch panel.

According to another embodiment, the plate GL is transparent and is arranged above a display screen with a touch panel. Thus, in FIGS. 4 and 5, the two electrodes LE, UE of the vibratory element PA formed on the plate SB, are linked to conductive paths BT1, BT2 through vias V1, V2 going through the plate SB. The paths BT1, BT2 are connected to conductive paths formed on the board PCB through connection balls BP1, BP2 also performing fixing the plate SB on the board PCB. In addition, the vibratory element PA is mechanically coupled to the plate GL.

In FIG. 4, the plate GL is associated with a plate of electrodes of touch panel CTS of capacitive type, arranged under the plate GL at a distance therefrom. The plate SB may be housed between the plate GL and the touch panel CTS. In FIG. 5, the plate GL is associated with a touch panel RTS of resistive type, arranged on the plate GL.

According to one embodiment, the plate GL and the touch panel CTS (or RTS) may be opaque and form a control touch panel.

According to another embodiment, the plate GL and the touch panel CTS (or RTS) are transparent and associated with a display DSP, for example a liquid crystal display, arranged under the touch panel CTS (FIG. 4) or the plate GL (FIG. 5). The plate SB may then be arranged between an edge of the touch panel CTS and an edge of the plate GL, so as not to hide a part of the display DSP. The board PCB may also be arranged so as not to hide a part of the display DSP as shown in FIGS. 4 and 5, for example facing the wafer SB.

In the embodiments of FIGS. 4 and 5, the touch panel may admittedly be used by the control unit CTLU to detect the presence of the user's hand.

Figure 6:
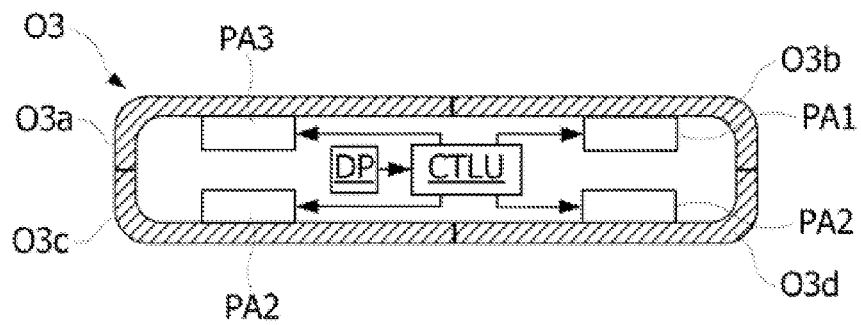
FIG. 6 schematically shows in cross-section an object provided with vibratory actuators, according to another embodiment.

FIG. 6 shows an object O3 comprising a housing having a substantially rectangular right section, provided to be handheld. The object O3 may for example be a mobile phone, a personal digital assistant (PDA), a global positioning system (GPS), a reader of multimedia files, a control interface of computer, etc.

According to one embodiment, vibratory actuators PA1, PA2, PA3, PA4 are installed in the object O3 and mechanically coupled respectively to four parts O3a, O3b, O3c, O3d of the housing of the object O3, which are susceptible of vibrating independently of each other. According to one embodiment, a control unit CTLU controls the actuators PA1-PA4 and is configured to generate for each actuator PA1-PA4 a different excitation signal adapted to the resonance frequency of the part O3a-O3d to which the actuator is coupled. The parts O3a-O3d may be configured so that when a user holds the object O3, the parts O3a-O3d are in contact with different parts of the hands holding or in contact with the object, like the palm of one hand and the fingers of the other hand. The parts O3a, O3b of the housing may comprise a touch panel or a display screen, possibly a touch screen. The parts O3c, O3d may also comprise a touch panel. Each touch panel is connected to the control unit CTLU so that the latter may sense the parts O3a-O3d of the housing that are in contact with the skin of the user.

Figure 7:
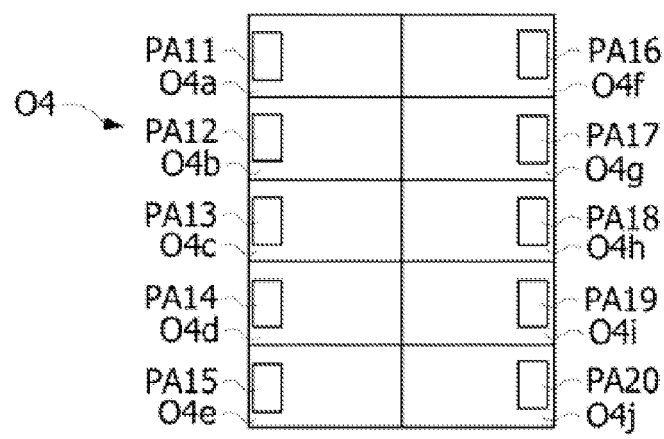
FIGS. 7 to 9 schematically show objects provided with vibratory actuators, according to other embodiments.

The handheld housing of object O3 may comprise more than four parts susceptible of vibrating independently of one another. Each part may be mechanically coupled to at least one vibratory actuator. Thus FIG. 7 shows an outer plate of an object O4 which may form an upper face of the object O3 comprising a touch display screen or a lower face of this object comprising a touch panel. The outer plate of object O4 is divided into ten parts O4a-O4j which are susceptible of vibrating independently of each other. Each of the parts O4a-O4j is mechanically coupled with a respective vibratory actuator PA11-PA20 which is controlled in an independent manner by a control unit such as the unit CTLU. In the example of FIG. 7, the parts O4a-O4j are arranged in two columns of five parts.

Figure 8:
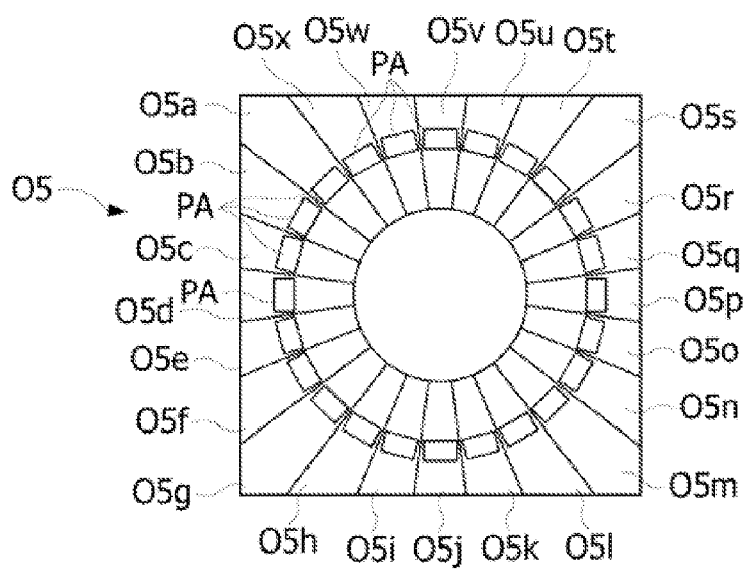

Other configurations of independent housing parts may be provided. FIG. 8 represents a plate O5 of a touch panel forming a rotary control button. The plate is divided into sectors O5a-05x, each sector being mechanically coupled with a vibratory actuator PA, the actuators PA being arranged along a circle.

Figure 9:
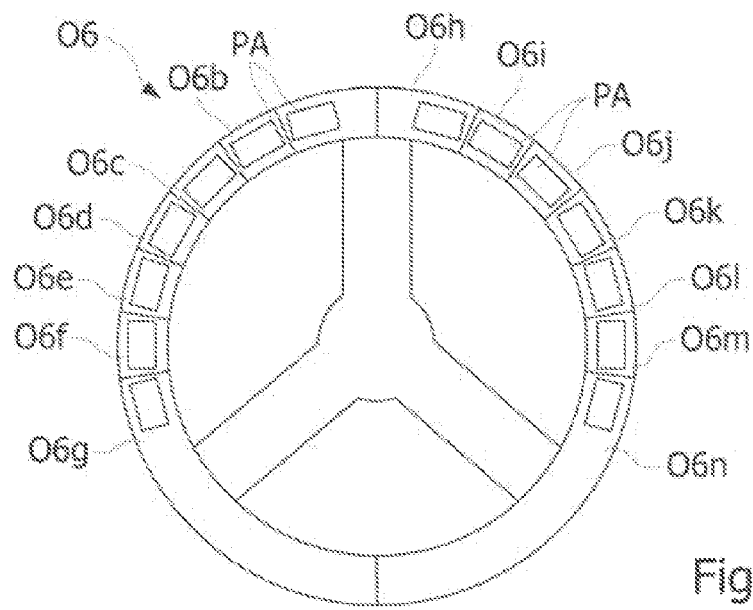

FIG. 9 represents a steering wheel O6 comprising a ring portion divided into parts O6a-O6n susceptible of vibrating independently of one another. Each of the parts O4a-O4j is mechanically coupled with a respective vibratory actuator PA which is controlled in an independent manner by a control unit such as the unit CTLU.

Figure 10:
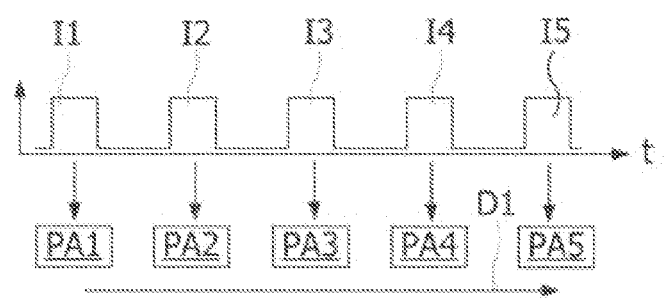
FIGS. 10 and 11 show timing diagrams of signals driving vibratory actuators according to embodiments.
Figure 11:
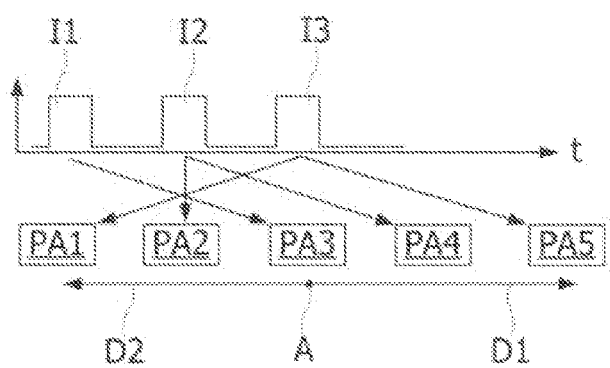

FIGS. 10 and 11 are timing diagrams of signals driving vibratory adjacent actuators PA1-PA5 according to embodiments. These signals comprise successive pulses 11-15 representing times when the actuators are activated. In FIG. 10, pulses 11-15 are respectively provided to the adjacent actuators PA1-PA5 in one direction D1 from actuator PA1 to actuator PA5, so that the user may sense a vibration propagating in this direction D1.

In FIG. 11, pulse 11 is provided to actuator PA3, pulse 12 is provided to the actuators PA2, PA4 which are adjacent to actuator PA3, and pulse 13 is provided to the actuators PA1, PA5 which are adjacent to actuators PA2 and PA4. In this manner the user may sense a vibration propagating simultaneously in two opposite directions D1, D2 from a point A corresponding to the location of actuator PA3.

The vibration propagating modes of FIGS. 10 and 11 may be applied to an array of n×m (n and m being greater than 2) vibratory actuators, so that the user may sense a vibration propagating in several distinct directions, simultaneously or not, and from or to a single or several points of the array surface.

It will be clear to those skilled in the art that the present disclosure is susceptible of various embodiments and applications. In particular, the disclosure is not limited to the use of vibratory elements of piezoelectric type. Any other type of vibratory element such as the electromagnetic or electrostatic type may be used within the frame of the present disclosure. Other vibratory elements may indeed fit in the target applications. Thus, each vibratory element may be made by forming on the wafer SB, a coil either perpendicular or parallel to the wafer, the inside of the coil being filled with a material with high magnetic permittivity, such as NiCr, CoFe or a permalloy.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a handheld object, the forming of the object including:
        forming first and second vibratory actuators;
        mechanically coupling the first vibratory actuator to a first part of the object;
        mechanically coupling the second vibratory actuator to a second part of the object, the first and second parts being configured to vibrate independently of each other, and being configured to contact different first and second areas, respectively, of a hand of a user holding the object; and
    coupling the first and second actuators to a control unit configured to transmit first and second electrical signals to the actuators, respectively, the first electrical signal having a first frequency corresponding to a first resonance frequency of the first part of the object and the second electrical signal having a second frequency corresponding to a second resonance frequency of the second part of the object, the first and second frequencies being different from each other.

2. The method according to claim 1, wherein forming the first vibratory actuator includes:
    forming a multilayer structure on a wafer, the forming of the multilayer structure including:
        forming a vibratory element configured to vibrate in response to the first electrical signal; and
        forming first and second electrodes coupled to the vibratory element, the electrodes being configured to transmit the first electrical signal to the vibratory element.

3. The method according to claim 2, wherein forming the first vibratory actuator further comprises:
    forming the first vibratory actuator on a first surface of the wafer;
    forming a first conductive via and a second conductive via through the wafer;
    electrically coupling the first and second electrodes to a second surface of the wafer using the first and second conductive vias.

4. The method according to claim 2, wherein forming each vibratory actuator includes depositing onto the wafer a piezoelectric material layer and etching the layer.

5. The method according to claim 2, wherein the first part of the object is a touch panel plate or touch panel display screen, or a part thereof.

6. A method, comprising:
    controlling a handheld object having a first part and a second part, the first and second parts being configured to be able to vibrate independently of each other, the controlling including:
        determining a first resonance frequency of the first part;
        determining a second resonance frequency of the second part;
        generating first and second electrical signals;
        transmitting the first electrical signals to a first vibratory actuator, the first vibratory actuator being mechanically coupled to the first part of the object, and the electrical signal having a frequency that corresponds to the first resonance frequency; and
        transmitting the second electrical signal to a second vibratory actuator, the second vibratory actuator being mechanically coupled to the second part of the object, and the second electrical signal having a second frequency that corresponds to the second resonance frequency, the first and second frequencies being different from each other.

7. The method according to claim 6, further comprising:
    selecting modulation signals as a function of texture effects to be transmitted to a user; and
    generating the texture effects by modulating the first and second electrical signals with the selected modulation signals.

8. The method according to claim 6, further comprising providing a detection signal indicating a presence of a user's hand within a distance of the object, and transmitting to the first and second actuators the first and second electrical signals, respectively in response to the detection signal.

9. The method according to claim 6, further comprising selecting the electrical signals based on a function of detected events or state information of the object.

10. The method according to claim 6, further comprising generating a linear vibration propagating through the vibratory actuators by configuring the electrical signals transmitted respectively to the vibratory actuators.

11. A handheld object, comprising:
a first part and a second part configured to vibrate independently of each other and configured to contact distinct first and second areas of a hand, respectively, of a user holding the object;
first and second vibratory actuators mechanically coupled to the first and second parts, respectively, of the object; and
a control unit configured to transmit first and second electrical signals to the first and second actuators, respectively, the first electrical signal having a first frequency adapted to a first resonance frequency of the first part and the second electrical signal having a second frequency adapted to a second resonance frequency of the second part, the first and second frequencies being different from each other.

12. The object according to claim 11, wherein the control unit is configured to:
select a plurality of modulation signals as a function of texture effects to be transmitted to the user; and
modulate each of the electrical signals transmitted to the actuators, with the selected modulation signals to generate the texture effects.

13. The object according to claim 11, wherein at least one of the first and second vibratory actuators is one of a plurality of vibratory actuators arranged along a line, the control unit being configured to transmit electrical signals to the plurality of vibratory actuators to generate a vibration that propagates along the line.

14. The object according to claim 11, further comprising a presence detector configured to detect the hand of the user within a distance of the object and configured to generate an indication of detection when the hand is within the distance, the control unit being configured to transmit the first and second electrical signals to the first and second vibratory actuators, respectively, in response to the indication of detection from the presence detector.

15. The object according to claim 11, wherein the control unit is configured to transmit the electrical signals based on a function of detected events or state information of the object.

16. A system, comprising:
a handheld object including:
first and second parts configured to vibrate independently of each other;
a plate associated with one of the first and second parts;
a touch panel configured to detect an input from a user on the plate;
first and second vibratory actuators mechanically coupled to the first and second parts, respectively, of the object; and
a control unit configured to transmit a first electrical signal to the first vibratory actuator and a second electrical signal to the second vibratory actuator, the first electrical signal having a first frequency adapted to a first resonance frequency of the first part and the second electrical signal having a second frequency corresponding to a second resonance frequency of the second part, the first and second frequencies being different from each other.

17. The system according to claim 16, further comprising a display screen associated with the touch panel, the plate being transparent and arranged on the display screen.

18. The system according to claim 16 wherein the touch panel is capacitive or resistive.

19. The system according to claim 16, further comprising a presence detector configured to detect a hand of the user within a distance of the object and configured to generate an indication of detection when the hand is within the distance, the control unit being configured to transmit the first and second electrical signals to the first and second vibratory actuators, respectively, in response to the indication of detection from the presence detector.

* * * * *